United States Patent
Liaw et al.

(10) Patent No.: US 7,485,974 B2
(45) Date of Patent: Feb. 3, 2009

(54) CHIP STRUCTURE WITH BEVEL PAD ROW

(75) Inventors: Yuan-Tsang Liaw, Taipei Hsien (TW); Chi-Hsing Hsu, Taipei Hsien (TW); Hung-Wen Shih, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 473 days.

(21) Appl. No.: 11/405,073

(22) Filed: Apr. 17, 2006

(65) Prior Publication Data

US 2006/0261497 A1    Nov. 23, 2006

Related U.S. Application Data

(60) Provisional application No. 60/683,529, filed on May 19, 2005.

(30) Foreign Application Priority Data

Nov. 7, 2005  (TW) .............................. 94138931 A

(51) Int. Cl.
*H01L 23/48* (2006.01)

(52) U.S. Cl. ............................... 257/786; 257/E23.079

(58) Field of Classification Search ................. 257/786, 257/E23.079
See application file for complete search history.

(56) References Cited

U.S. PATENT DOCUMENTS 6,921,981 B2 *  7/2005  Tien ........................... 257/786

* cited by examiner

*Primary Examiner*—Leonardo Andújar
*Assistant Examiner*—Krista Soderholm
(74) *Attorney, Agent, or Firm*—J.C. Patents

(57) ABSTRACT

A chip structure with a bevel pad row comprises a substrate, a plurality of middle pad rows, and a bevel pad row. The substrate has an active surface including a middle wire bonding area and a corner wire bonding area. The middle wire bonding area is adjacent to a side of the active surface. The corner wire bonding area is adjacent to the side and a end of the middle wire bonding area, and the corner wire bonding area has a bevel edge with an acute incline angle to the side. The middle pad rows are disposed in the middle wire bonding area, and the bevel pad row is disposed along the bevel edge of the corner wire bonding area. The bevel pad row has a plurality of bevel pads, and the quantity of which is greater than that of the middle pad rows in the middle wire bonding area.

9 Claims, 2 Drawing Sheets

CHIP STRUCTURE WITH BEVEL PAD ROW

CROSS-REFERENCE TO RELATED APPLICATION

This application claims the priority benefits of U.S. provisional application Ser. No. 60/683,529, filed on May 19, 2005. This application also claims the priority benefit of Taiwan application serial no. 94138931, filed on Nov. 7, 2005. All disclosure of this application are incorporated herein by reference.

BACKGROUND OF THE INVENTION

1. Field of the Invention

The present invention relates to a chip structure, and more particularly, to a chip structure with a bevel pad row.

2. Description of the Related Art

Along with the continuous development of new electronic technologies, the electronic products are designed to be more user friendly, lighter, thinner, shorter, smaller, and have more powerful functions, thus the circuit and mechanical designs for various electronic products are more complicated. For the IC chip package technique, the wire bonding technique is commonly used to electrically couple the chip with the carrier. With such technique, one end of the bonding wire is electrically coupled to a pad on an active surface of the chip, and the other end of the bonding wire is electrically coupled to a contact point on the carrier. Since there are certain limitations in the wire bonding technique, the pads are usually disposed on the active surface of the chip with a peripheral arrangement manner.

FIG. 1 schematically shows a diagram of a conventional chip structure. Referring to FIG. 1, an active surface 110 of the chip 100 has a middle wire bonding area 110a and a corner wire bonding area 110b. Both of the middle wire bonding area 110a and the corner wire bonding area 110b are adjacent to a side 110c of the active surface 110 of the chip 100. In addition, the middle wire bonding area 110a has a plurality of middle pads 120a that are disposed along an extension direction of the side 110c, such that a plurality of middle pad rows is arranged inside the middle wire bonding area 110a. Moreover, the corner wire bonding area 110b has a plurality of corner pads 120b that are disposed along the extension direction of the side 110c, such that a plurality of corner pad rows is arranged inside the corner wire bonding area 110b.

For example, if the spacing d1 between two adjacent middle pads 120a inside the middle wire bonding area 110a is 60 μm, the bonding wire connecting to the corner pad of the corner wire bonding area 110b and the side 110c of the chip 100 form an acute angle. In order to successfully perform the subsequent wire bonding process, the spacing d2 between two adjacent corner pads 120b inside the corner wire bonding area 110b should be substantially equal to 85 μm, and there should be nine corner pads 120b in the same corner pad row. In other words, if the spacing d1 between two adjacent middle pads 120a inside the middle wire bonding area 110a is 60 μm, the width dt of the corner wire bonding area 110b should be greater than 9×85=765 μm. However, the corner wire bonding area 110b with such width dt (=765 μm) causes a difficulty in improving the pad arrangement density in the conventional technique.

SUMMARY OF THE INVENTION

The present invention provides a chip structure with a bevel pad row. The chip structure comprises a substrate with an active surface. The active surface comprises at least one middle wire bonding area and at least one corner wire bonding area. The middle wire bonding area adjacent to a side of the active surface comprises a plurality of middle pad rows that are arranged along the side of the active surface. In addition, the corner wire bonding area is adjacent to the side of the active surface. The corner wire bonding area adjacent to one end of the middle wire bonding area has a bevel edge with an acute angle to the side of the active surface. The corner wire bonding area comprises a bevel pad row that is arranged along the bevel edge mentioned above, and the quantity of the bevel pads in the bevel pad row is greater than the row number of the middle pad rows in the middle wire bonding area.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DESCRIPTION OF THE PREFERRED EMBODIMENTS

Figure 1:
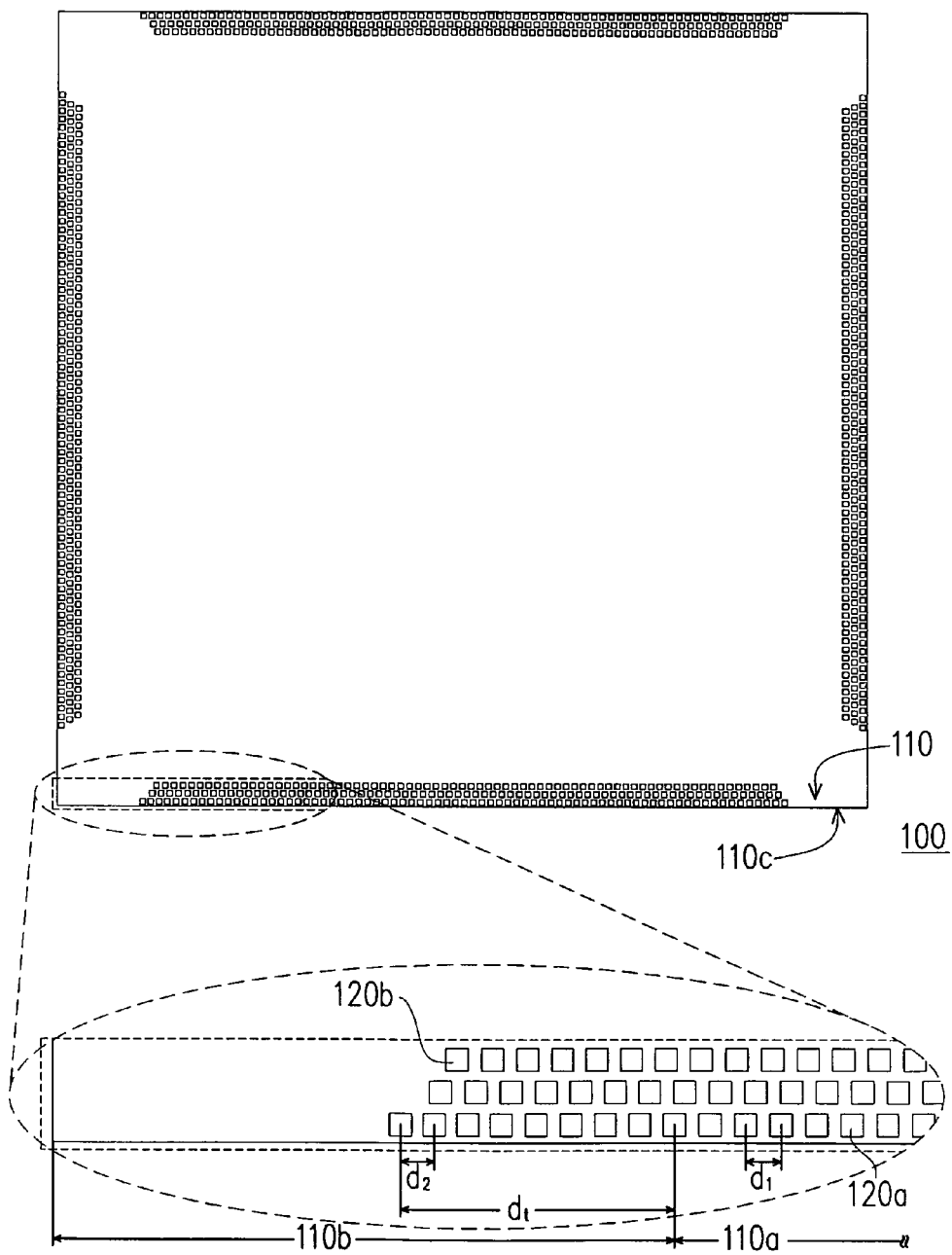
FIG. 1 schematically shows a diagram of a conventional chip structure.
Figure 2:
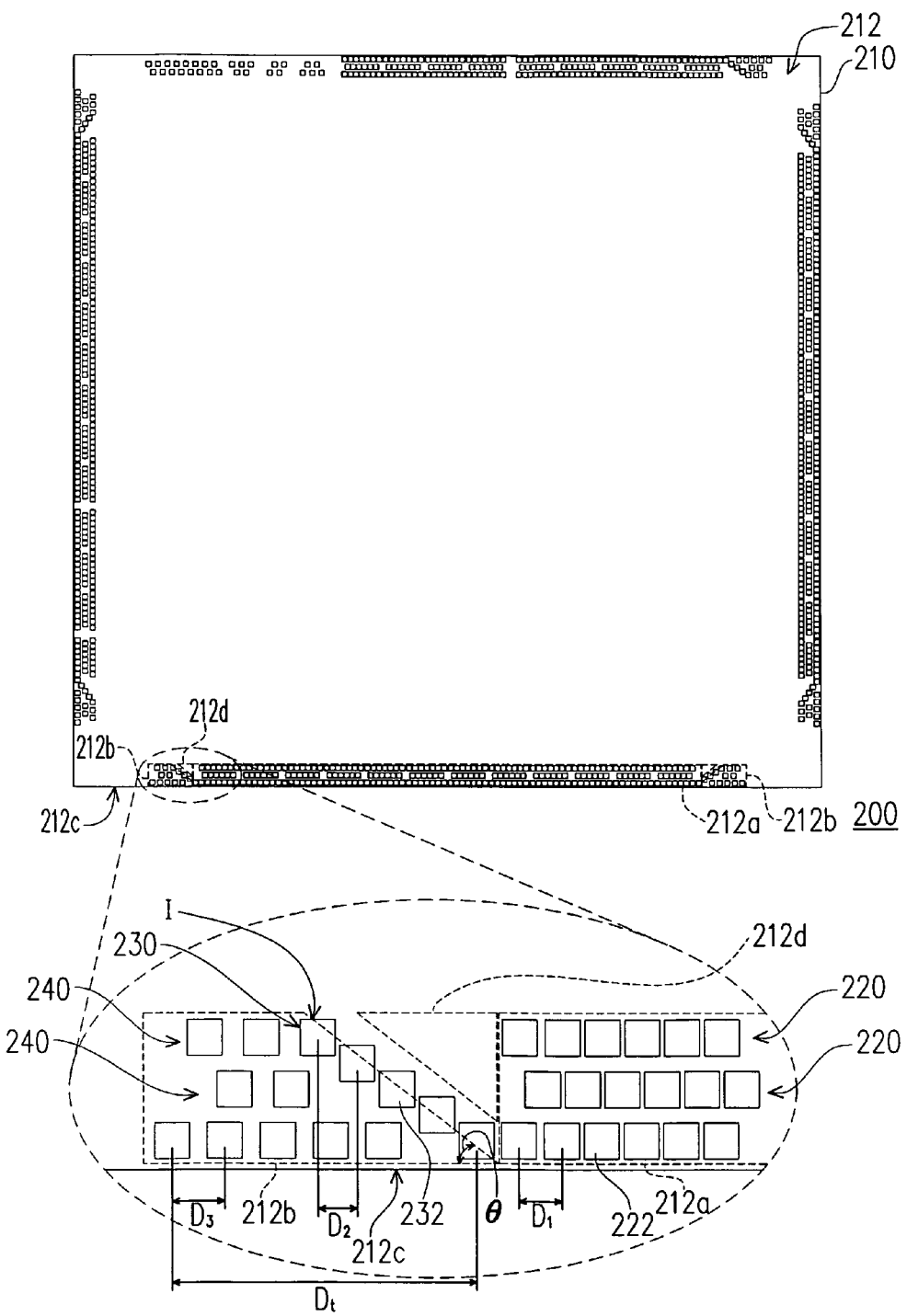
FIG. 2 schematically shows a diagram of a chip structure with a bevel pad row according to an embodiment of the present invention.

FIG. 2 schematically shows a diagram of a chip structure with a bevel pad row according to an embodiment of the present invention. Referring to FIG. 2, the chip structure 200 comprises a substrate 210 with an active surface 212. The substrate 210 of the chip structure 200 is made of silicon, for example. The active surface 212 has a corner, and a side 212c of the active surface 212 further extends to the corner. The active surface 212 comprises a middle wire bonding area 212a and a corner wire bonding area 212b. The middle wire bonding area 212a is adjacent to the side 212c of the active surface 212. In addition, the corner wire bonding area 212b adjacent to the side 212c of the active surface 212 comprises a bevel edge I. The bevel edge I is adjacent to the middle wire bonding area 212a, and the incline angle between the bevel edge I and the side 212c is θ, where 0°<θ<90°. The active surface 212 further comprises a blank area 212d where no pad is disposed. The blank area 212d is disposed between the middle wire bonding area 212a and the corner wire bonding area 212b. In the present embodiment, the blank area 212d may be into a triangle. Moreover, in other embodiments, the blank area 212d may be into a trapezoid or another shape.

The chip structure 200 further comprises a plurality of middle pad rows 220 that are arranged substantially along the side 212c. Each of the middle pad rows 220 is composed of a plurality of middle pads 222, and the spacing between two adjacent middle pads 222 is D1. In addition, the chip structure 200 further comprises a bevel pad row 230 disposed in the corner wire bonding area 212b and arranged along the bevel edge I. The bevel pad row 230 is composed of a plurality of bevel pads 232. It is to be noted that the quantity of the bevel pads 232 in the bevel pad row 230 is greater than the row number of the middle pad rows 220 in the middle wire bonding area 212a. The quantity of the bevel pads 232 can be determined by the allowable spacing of the bonding wire in the wire bonding process and the incline angle θ mentioned above.

The chip structure 200 further comprises a plurality of corner pad rows 240. The corner pad rows 240 are arranged substantially along the side 212c and substantially parallel to the middle pad rows 220. The bevel pad row 230 is disposed between the corner pad rows 240 and the middle pad rows 220. In addition, each of the corner pad rows 240 comprises a plurality of corner pads 242. The spacing D3 between two adjacent corner pads 242 can be designed as greater than or equal to the spacing D2 between two adjacent bevel pads 232. In addition, the spacing D1 between two adjacent middle pads 222 may be designed as shorter than the spacing D3 between two adjacent corner pads 242.

It is to be noted that since a bevel pad row 230 is configured in the pad inside the corner wire bonding area 212b, comparing with the corner wire bonding area 110b in the conventional technique, the corner wire bonding area 212b of the present embodiment has a shorter width Dt. Accordingly, under the condition of chips with the same size, the total length of the middle wire bonding area 212a of the present embodiment is longer than that of the middle wire bonding area 110a in the conventional technique. Accordingly, with such design of the bevel pad row 230 in the present embodiment, the chip structure 200 of the present embodiment can provide a higher pad arrangement density.

In the chip structure 200 disclosed in the present embodiment, the active surface 212 may further comprise another corner wire bonding area 212b, such that the middle wire bonding area 212a can be disposed between these two corner wire bonding areas 212b. In other words, these two corner wire bonding areas 212b are disposed on both ends of the middle wire bonding area 212a, respectively.

In summary, in the chip structure disclosed in the present invention, a bevel pad row is disposed in the corner pad area and arranged along the bevel edge of the corner wire bonding area. In addition, the quantity of the bevel pads in the bevel pad row is configured as greater than the row number of the middle pad rows. Accordingly, when the spacing between two adjacent middle pads of the present invention is configured as the same as the spacing between two adjacent middle pads in the conventional technique, a shorter spacing can be configured between two adjacent corner pads in the corner pad row of the present invention. Therefore, comparing to the conventional chip structure, the chip structure disclosed in the present invention has a shorter length of the corner wire bonding area and a larger length of the middle wire bonding area. Accordingly, the chip disclosed in the present invention can provide a higher pad arrangement density.

Although the invention has been described with reference to a particular embodiment thereof, it will be apparent to one of the ordinary skills in the art that modifications to the described embodiment may be made without departing from the spirit of the invention. Accordingly, the scope of the invention will be defined by the attached claims not by the above detailed description.

What is claimed is:

1. A chip structure with a bevel pad row, comprising:
a substrate having an active surface, and the active surface comprising:
at least a middle wire bonding area adjacent to a side of the active surface; and
at least a corner wire bonding area adjacent to the side of the active surface and a end of the middle wire bonding area, wherein the corner wire bonding area has a bevel edge with an acute incline angle to the side of the active surface;
a plurality of middle pad rows disposed in the middle wire bonding area and arranged along the side of the active surface; and
a bevel pad row disposed in the corner wire bonding area and arranged along the bevel edge,
wherein the bevel pad row has a plurality of bevel pads, and a quantity of the bevel pads is greater than a row number of the middle pad rows in the middle wire bonding area.

2. The chip structure with the bevel pad row of claim 1, wherein the active surface further comprises:
a blank area disposed between the middle wire bonding area and the corner wire bonding area.

3. The chip structure with the bevel pad row of claim 1, further comprising:
a plurality of corner pad rows disposed in the corner wire bonding area and arranged along the side of the active surface, wherein the corner pad rows are substantially parallel to the middle pad rows, and the bevel pad row is disposed between the corner pad rows and the middle pad rows.

4. The chip structure with the bevel pad row of claim 3, wherein each of the corner pad rows comprises a plurality of corner pads, and a first spacing between two adjacent corner pads is greater than or equal to a second spacing between two adjacent bevel pads.

5. The chip structure with the bevel pad row of claim 4, wherein the middle pad rows comprise a plurality of middle pads, and a third spacing between two adjacent middle pads is shorter than the first spacing.

6. The chip structure with the bevel pad row of claim 1, wherein the active surface has a corner, the side of the active surface extends to the corner, and the corner wire bonding area is relatively close to the corner than the middle wire bonding area.

7. The chip structure with the bevel pad row of claim 1, wherein a quantity of the bevel pads in the bevel pad row is determined by an allowable spacing of a bonding wire in a wire bonding process and an acute incline angle.

8. The chip structure with the bevel pad row of claim 2, wherein the blank area is a triangle.

9. The chip structure with the bevel pad row of claim 2, wherein the blank area is a trapezoid.

* * * * *